United States Patent
Yang (10) Patent No.: US 8,858,808 B2
(45) Date of Patent: Oct. 14, 2014

(54) METHOD OF THIN PRINTED CIRCUIT BOARD WET PROCESS CONSISTENCY ON THE SAME CARRIER

(75) Inventor: Cheng-Hsiung Yang, Taoyuan (TW)

(73) Assignee: Kinsus Interconnect Technology Corp., Taoyuan (TW)

( * ) Notice: Subject to any disclaimer, the term of this patent is extended or adjusted under 35 U.S.C. 154(b) by 234 days.

(21) Appl. No.: 13/448,478

(22) Filed: Apr. 17, 2012

(65) Prior Publication Data

US 2013/0270216 A1 Oct. 17, 2013

(51) Int. Cl.
*H01B 13/00* (2006.01)

(52) U.S. Cl.
USPC .................... 216/13; 216/14; 216/18; 438/11

(58) Field of Classification Search
USPC ............... 216/13, 14, 21, 19, 83, 95, 108, 75;
118/108, 425, 630; 438/111, 123, 125
See application file for complete search history.

(56) References Cited

U.S. PATENT DOCUMENTS

| | | | | |
|---|---|---|---|---|
| 2,984,597 A | * | 5/1961 | Hennes | 156/151 |
| 4,511,448 A | * | 4/1985 | Tanaka et al. | 204/198 |
| 6,042,648 A | * | 3/2000 | Corey et al. | 118/423 |
| 2009/0000111 A1 | * | 1/2009 | Schneider | 29/791 |

* cited by examiner

*Primary Examiner* — Lan Vinh
(74) *Attorney, Agent, or Firm* — Rosenberg, Klein & Lee (57) ABSTRACT

A method of thin printed circuit board wet process consistency on the same carrier, and more particularly to a printed circuit board in the developing, copper plating, stripping, etching and other wet processes uses the same frame as a carrier from the beginning to the end of the wet process, such that the thin printed circuit board is conducted a continuous and automatic wet process to avoid disassembly, storage and transportation between each process. Moreover, when using the flame, the thin printed circuit board is smooth and flattening in the wet process for avoiding "water effect," the effective area is not exposed to any mechanical members for preventing scratches, and there are point contacts between the thin printed circuit board and the frame for preventing chemical residue. Accordingly, the present invention can not only enhance the yield of the thin printed circuit board but also shorten the production time.

8 Claims, 10 Drawing Sheets

METHOD OF THIN PRINTED CIRCUIT BOARD WET PROCESS CONSISTENCY ON THE SAME CARRIER

BACKGROUND OF THE INVENTION

1. Field of the Invention

The present invention relates to a method of thin printed circuit board wet process consistency on the same carrier and more particularly, to a continuous auto-consistent wet process method for enhancing the efficiency of the printed circuit board wet process by means of the same frame as a carrier.

2. Description of the Related Art

The process of a printed circuit board (PCB) includes a dry process and a wet process, wherein the printed circuit board requires immersing in different liquid in the wet process. For example, the printed circuit board requires being sprayed the developer in the developing process after the exposure process, and the printed circuit board requires being sprayed the rinsing fluid in the rinsing process, and so as the follow-up of plating, stripping, etching and other processes within the wet process.

Figure 1:
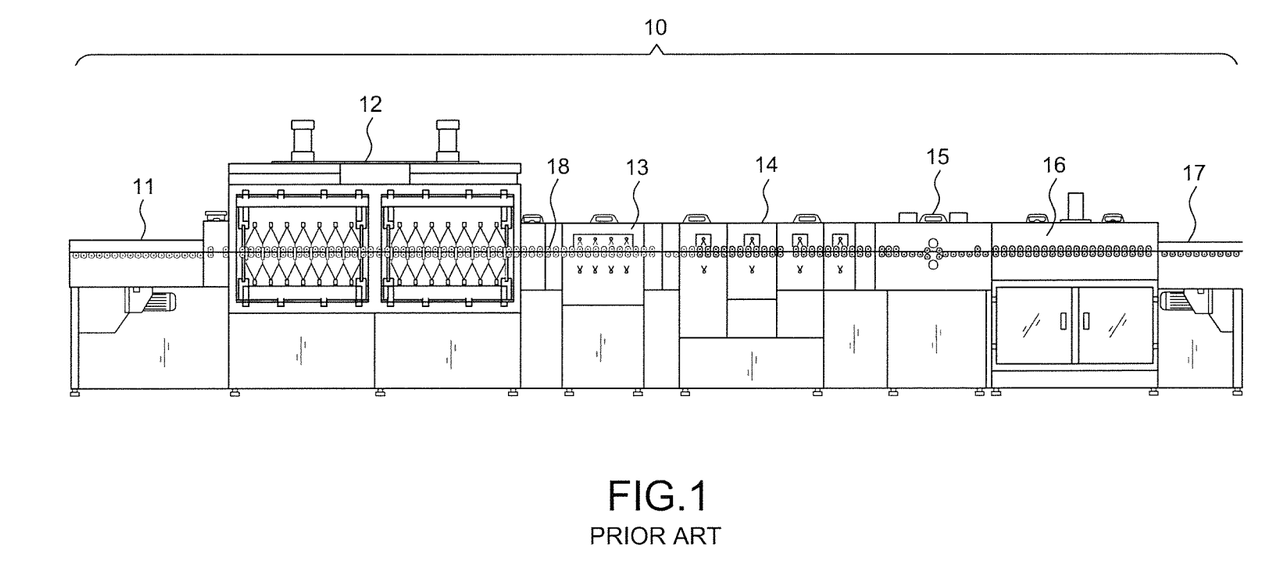
FIG. 1 is a schematic view of a conventional horizontal wet process.

The manufacturing method of the printed circuit board wet process can be broadly divided into two ways, horizontal production and vertical production. The so-called horizontal production as shown in FIG. 1 illustrates a developing process device 10 including a loading unit 11, a first developing unit 12, a second developing unit 13, a rinsing unit 14, a drying unit 15, a baking unit 16 and an unloading unit 17. The printed circuit board is conveyed through aforementioned various units by a conveying roller 18.

A slippery phenomenon sometimes happens between the conveying roller 18 and the printed circuit board resulting in the problems of sticking boards or stacking boards. When spraying the chemical liquid on the horizontal printed circuit board, the chemical liquid is easily left in the printed circuit board, resulting in so-called "water effect." In other words, the horizontal machine will cause two types of effects; one effect is that the discharging speed of the liquid on an edge of the printed circuit board is faster than the center thereof. That is, the liquid on the center of the printed circuit board requires a longer distance for discharging, such that the liquid on the edge of the printed circuit board has discharged while the liquid on the center of the printed circuit board has not discharged yet and thus an accumulation of liquid is produced on the thin printed circuit board, such that the accumulation of the liquid lower the chemical reaction on the printed circuit board. Another effect is that the accumulation of the liquid affects the new liquid entering to the printed circuit board. That is, the liquid on the edge of the printed circuit board is thinner than the liquid on the center of the printed circuit board, thus the new liquid on the edge of the printed circuit board can easily enter into the printed circuit board and vice versa to cause a difference of chemical reaction speed.

Due to the printed circuit board are more and more precise now, it is easy to contact with the circuits and cause the damage of the circuits by using the roller to covey the printed circuit board and thus affects the production yield of the printed circuit board.

Another manufacturing method of the printed circuit board wet process is the vertical production method providing many printed circuit boards arranged in a matrix manner and being fixed on a rack, and then being moved to the designated treatment cell to conduct the wet process by a hoist.

Figure 2:
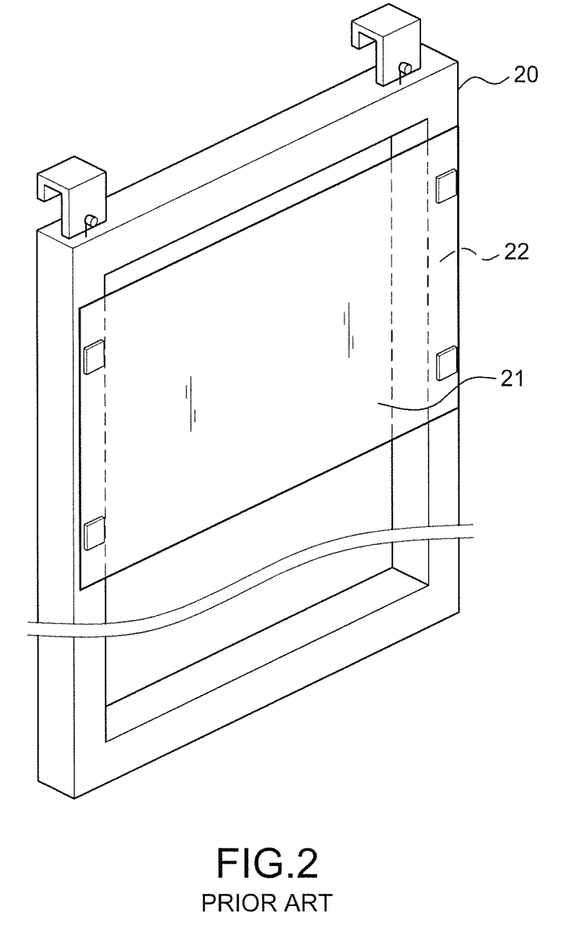
FIG. 2 is a schematic view of a conventional frame.

In the traditional wet process such as developing, plating, stripping, and etching processes has separated device. For example, the developing process belongs to horizontal production, and the plating process belongs to vertical production. Thus, when moving the printed circuit board from the developing device to the plating device, the printed circuit board is easy to be scratched and damaged, more particularly to a thin printed circuit board or a soft printed circuit board. TW Patent No. M381635 as shown in FIG. 2 discloses a mainframe 20 serves as a carrier for copper plating on a printed circuit board 21. The contacted surface between the mainframe 20 and the printed circuit board 21 is large so the chemical liquid can be easily remained on the mainframe 20. If using one frame for one process or chemical liquid, it may not have the problem of cross-contamination between different cells. However, this kind of mainframe 20 does not apply to different processes thus cannot be used in a continuous process.

The non-continuous device is used in the conventional printed circuit board wet process, wherein the printed circuit board is conveyed through the developing device to plating device or to other devices by manual labor, resulting in higher cost and lower capacity. Therefore, there is room for improvement.

SUMMARY OF THE INVENTION

It is the main object of the present invention to provide a method of thin printed circuit board wet process consistency on the same carrier, which provides a plurality of flanges corresponding to a plurality of positioning holes of a thin printed circuit board being evenly spread on a frame, and uses a securing member with a small contacted surface to fix on a positioning member in order to form a point contact, such that a chemical liquid is not easy to remain in the thin printed circuit board and the even point contacts enable a copper to evenly be spread on the thin printed circuit board while plating.

Another object of the present invention is to provide a method of thin printed circuit board wet process consistency on the same carrier, which enables the thin printed circuit board wet process such as developing, copper plating, stripping, and etching to set on an automated route, and each piece of the printed circuit board is hanged by the same frame from the beginning to the end of the wet process. The printed circuit board is moved to each designated treatment cell by a hoist, and one thin printed circuit board is vertically immersed in one treatment cell without moving the printed circuit board from one process to another, such that the chemical reaction or the plating reaction on the thin printed circuit board is evenly reacted.

A further object of the present invention is to provide a method of thin printed circuit board wet process consistency on the same carrier, which enables the thin print circuit board to be hanged by the same frame in whole wet process to avoid the water effect, and enables the wet process of the thin printed circuit board become an automation process which can not only save spaces and costs, but also prevent damages of the precise circuits on the printed circuit board for enhancing the yield and quality of the thin printed circuit board.

To achieve the above objects, a method of thin printed circuit board wet process consistency on the same carrier comprises the steps of:

a) providing a frame including a rectangular rigid frame body made of conductive material, a plurality of flanges inwardly extending from an inside frame edge thereof, and an electroconductive positioning member being set on the flange;

b) providing a thin printed circuit board being smaller than the inside frame edge of the frame, an edge of the thin printed circuit board having a positioning hole corresponding to the positioning member for hanging the thin printed circuit board on the frame, such that the thin printed circuit board stays smooth and flat, and the edge of the thin printed circuit board being not contacted with the inside frame edge of the frame; that is, there is only a point contact between the periphery of the positioning hole and the positioning member;

c) providing a plurality of securing members fixing on the positioning members, and the securing member corresponding to a surface of the thin printed circuit board has an electroconductive contacted surface, such that the surface of the thin printed circuit board is electronically connected to the frame by the securing members and positioning members;

d) providing a plurality of treatment cells being arranged in sequence, and a predetermined chemical being required for the wet process is respectively arranged in the treatment cells; and e) providing a plurality of hoist devices being arranged above a plurality of treatment cells, moving back and forth for the frame to be clamped and moved to each designated treatment cell in order to conduct the wet process.

Based on the technical features disclosed, wherein the frame illustrated in step a) is composed of metal plate.

Further, the frame includes a hanger made of conductive material has a contacted part on both ends thereof, and a purity of fixtures are provided on the hanger for clamping the frame.

Further, the treatment cells illustrated in step d) include a plurality of developing cells, copper plating cells, stripping cells, etching cells, and peeling cells. A V-shaped block is provided on both top sides of the treatment cells, and both ends of the hanger corresponding to the V-shaped block have the contacted part for setting across on the V-shaped block.

Furthermore, the V-shaped block on both sides of the copper plating cell is connected to the power supply, such that the hanger conducts electricity when the contacted part on both ends of the hanger sets across on the V-shaped block, and the fixture on the hanger is electronically connected to the frame, such that a current passes through the positioning member and the securing member of the frame to the thin printed circuit board for copper platting on through holes of the thin printed circuit board.

The securing member as illustrated in step c) comprises: an external cover being made of elastic material and a metallic buckle provided at the bottom of the external cover, the middle of the metallic buckle corresponding to the positioning member has a buckling hole for clamping the positioning member, and the metallic buckle having the eletroconductive contacted surface contacting with the surface of the thin printed circuit board.

Moreover, the external cover is made of rubber and the metallic buckle is made of copper. The positioning member serves as a pin which is perpendicular to the surface of the flange for hanging the positioning hole of the thin printed circuit board.

Based on the technical features disclosed, a method of thin printed circuit board wet process consistency on the same carrier in accordance with the present invention enables wet process: the developing, copper plating, stripping, and etching to be integrated into the same carrier for saving the number of the loading and unloading machines and manpower, and reducing the dust attached on the printed circuit board while moving the printed circuit board from one machine to another such improves the yield and saves the costs.

DETAILED DESCRIPTION OF THE PREFERRED EMBODIMENT

Figures 3, 3A, 3B:
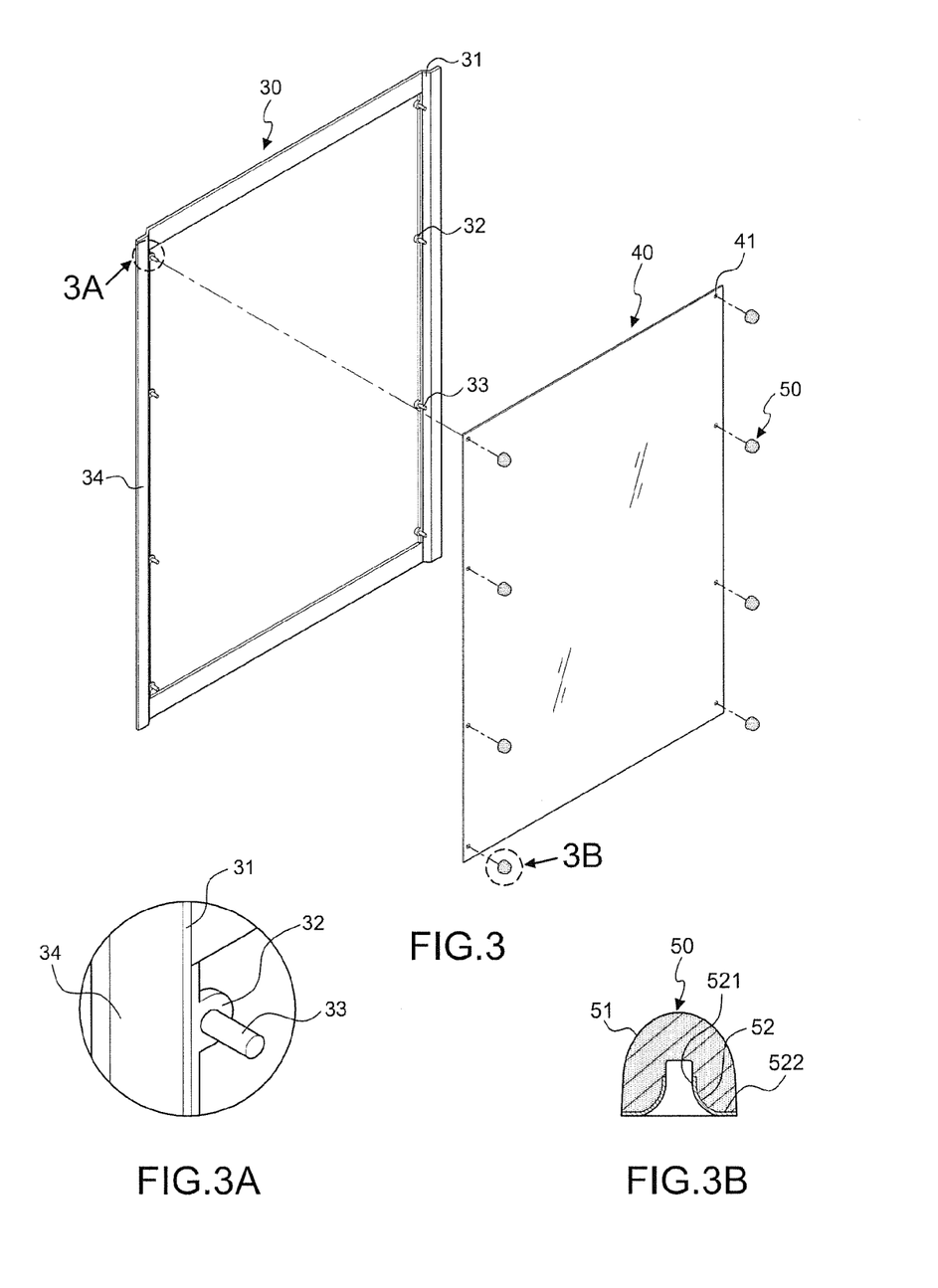
FIG. 3 is an exploded schematic view of the frame in accordance with the present invention.
FIG. 3A is a cross-sectional view taken along the line 3A-3A in FIG. 3.
FIG. 3B is a cross-sectional view taken along the line 3B-3B in FIG. 3.
Figure 4:
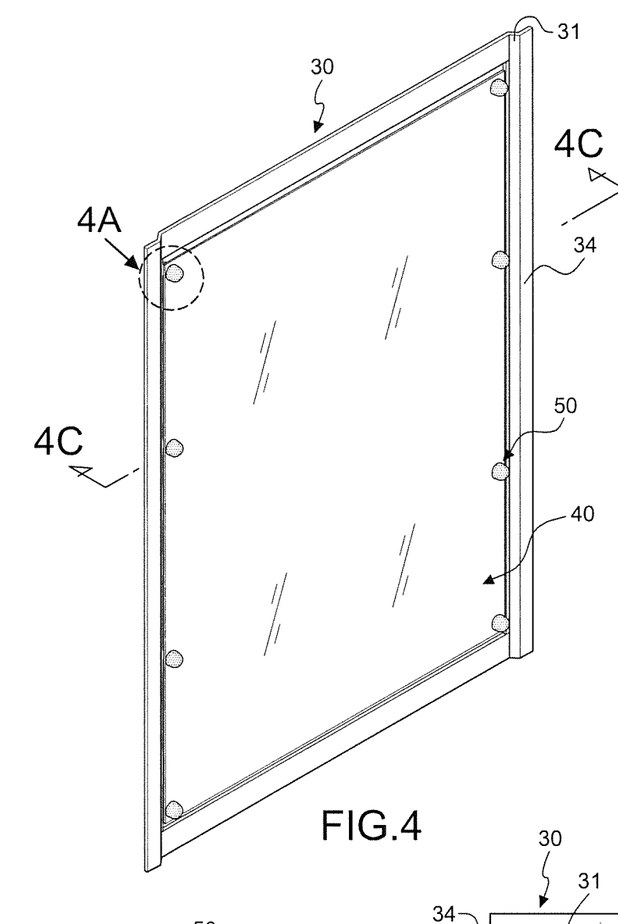
FIG. 4 is schematic view of the frame assembly in accordance with the present invention.
Figure 4A:
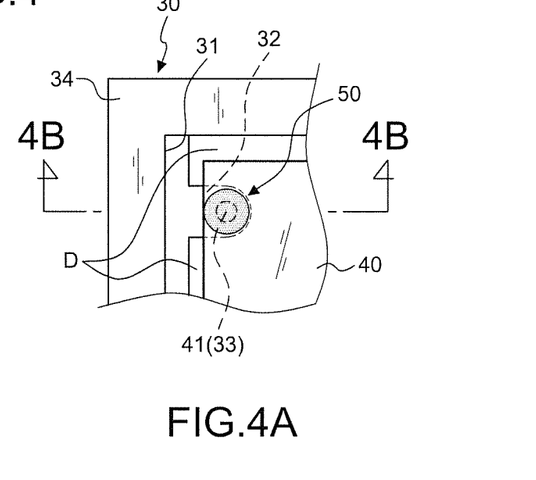
FIG. 4A is an enlarged plan view of 4A in FIG. 4.
Figure 4B:
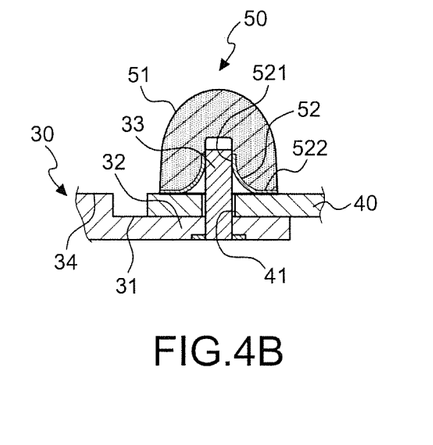
FIG. 4B is a cross-sectional view taken along the line 4B-4B in FIG. 4A.
Figure 4C:
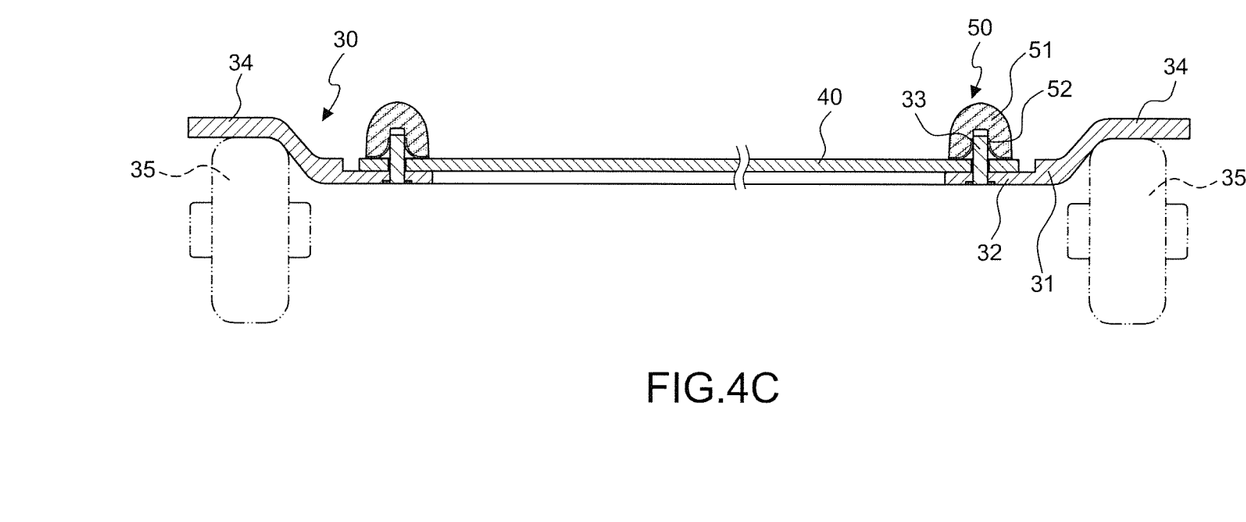
FIG. 4C is a cross-sectional view taken along the line 4C-4C in FIG. 4.
Figure 5:
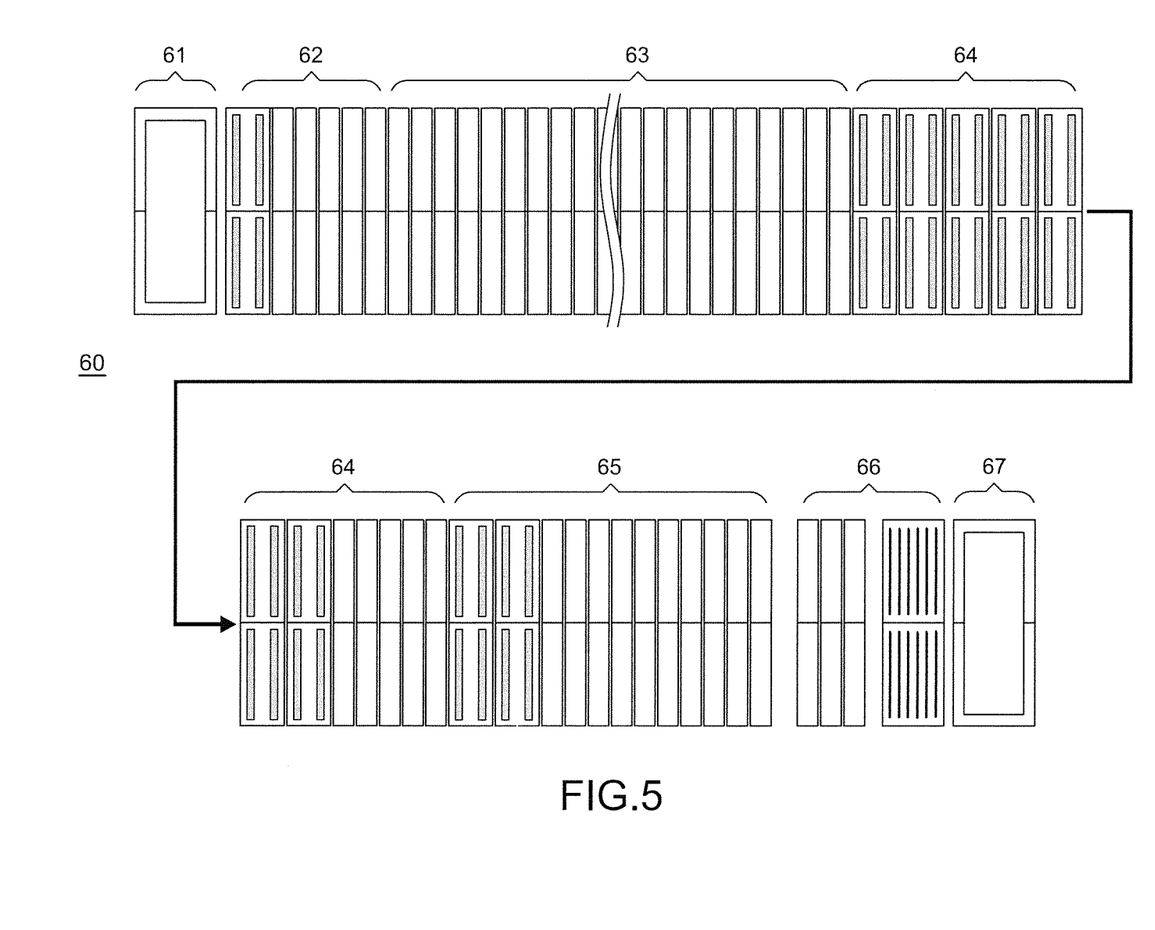
FIG. 5 is a schematic view of the plurality of the treatment cells in accordance with the present invention.
Figure 6:
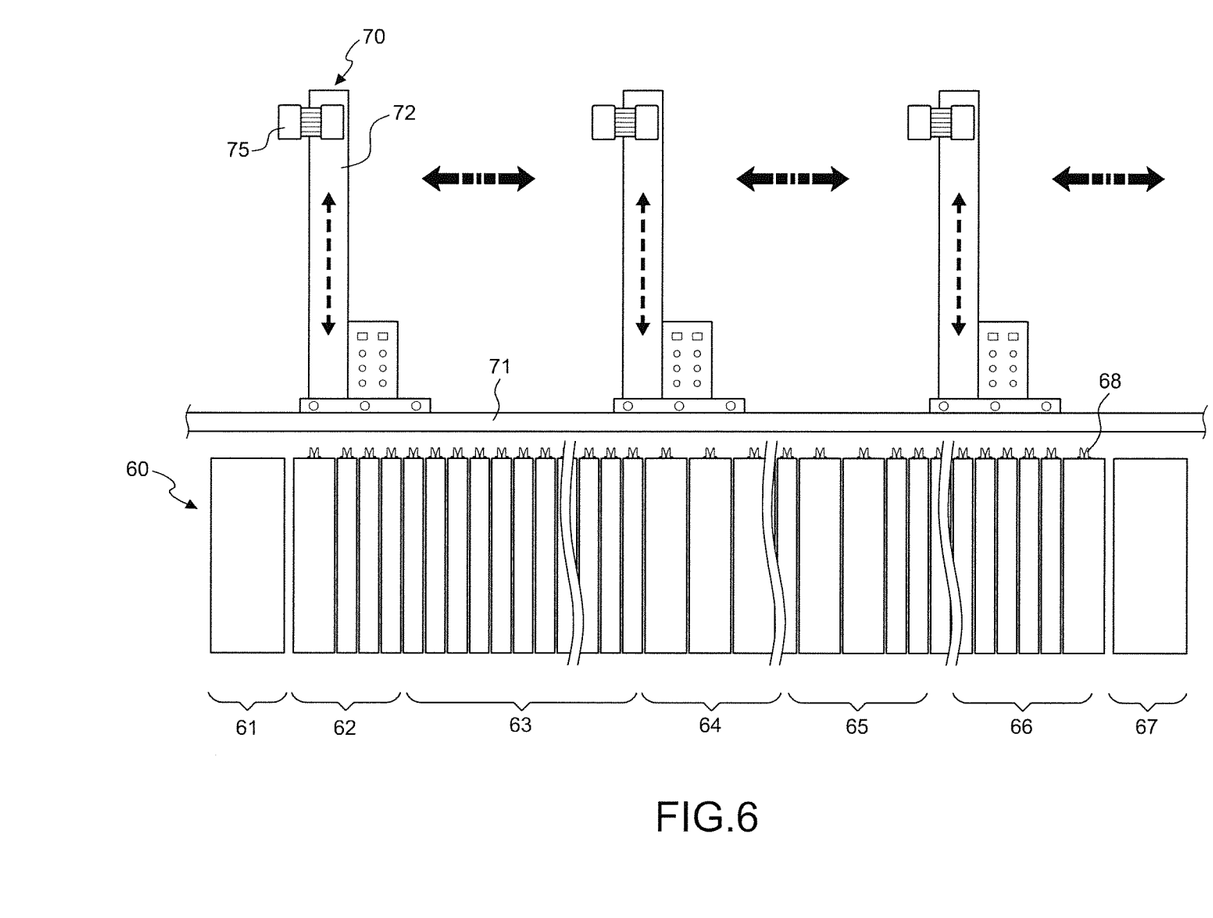
FIG. 6 is an application example of the moving hoist device in accordance with the present invention.
Figure 7A:
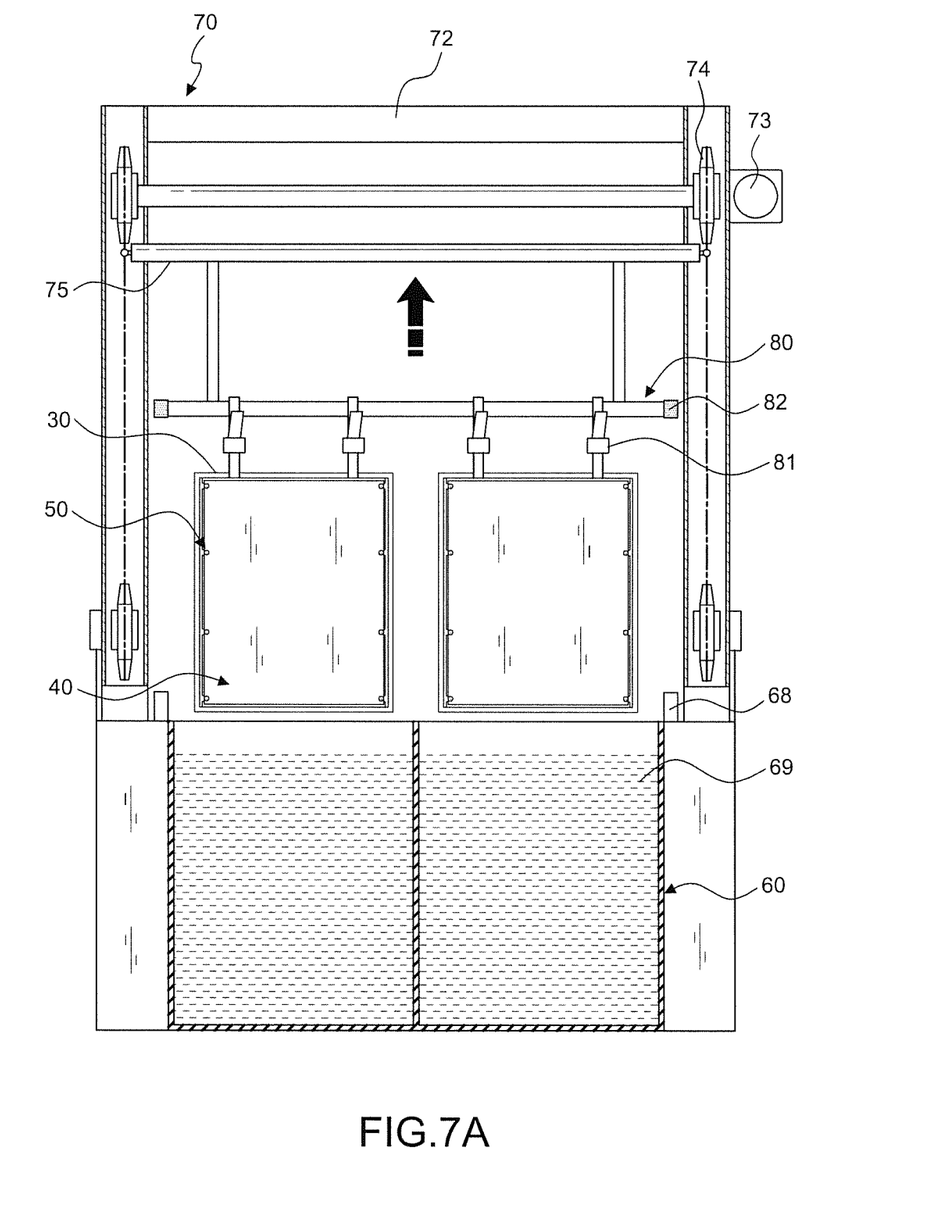
FIG. 7A is an application example of the present invention illustrating the printed circuit board being moved up by the hoist device.
Figure 7B:
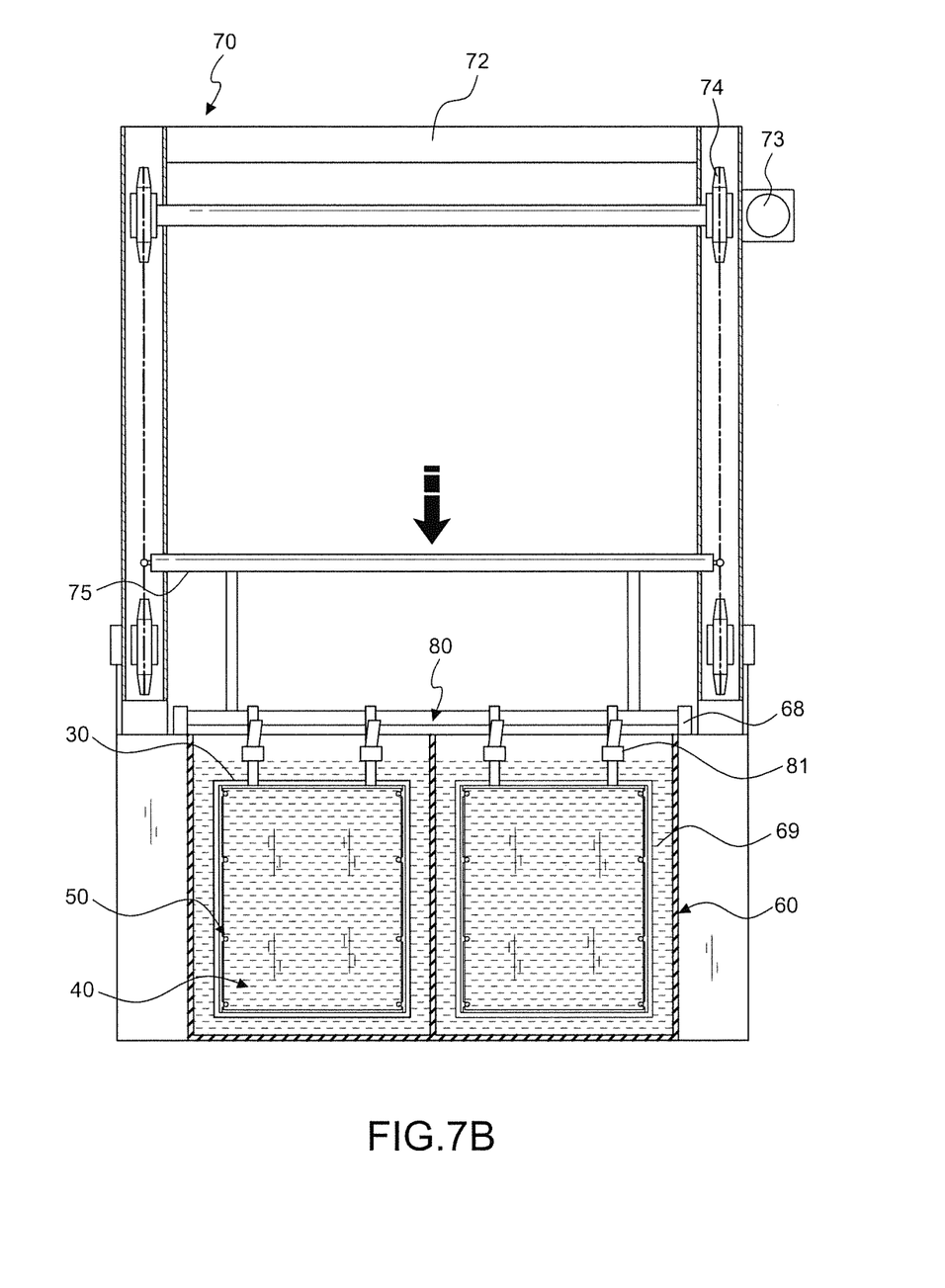
FIG. 7B is an application example of the present invention illustrating the printed circuit board being moved down by the hoist device.
Figure 8:
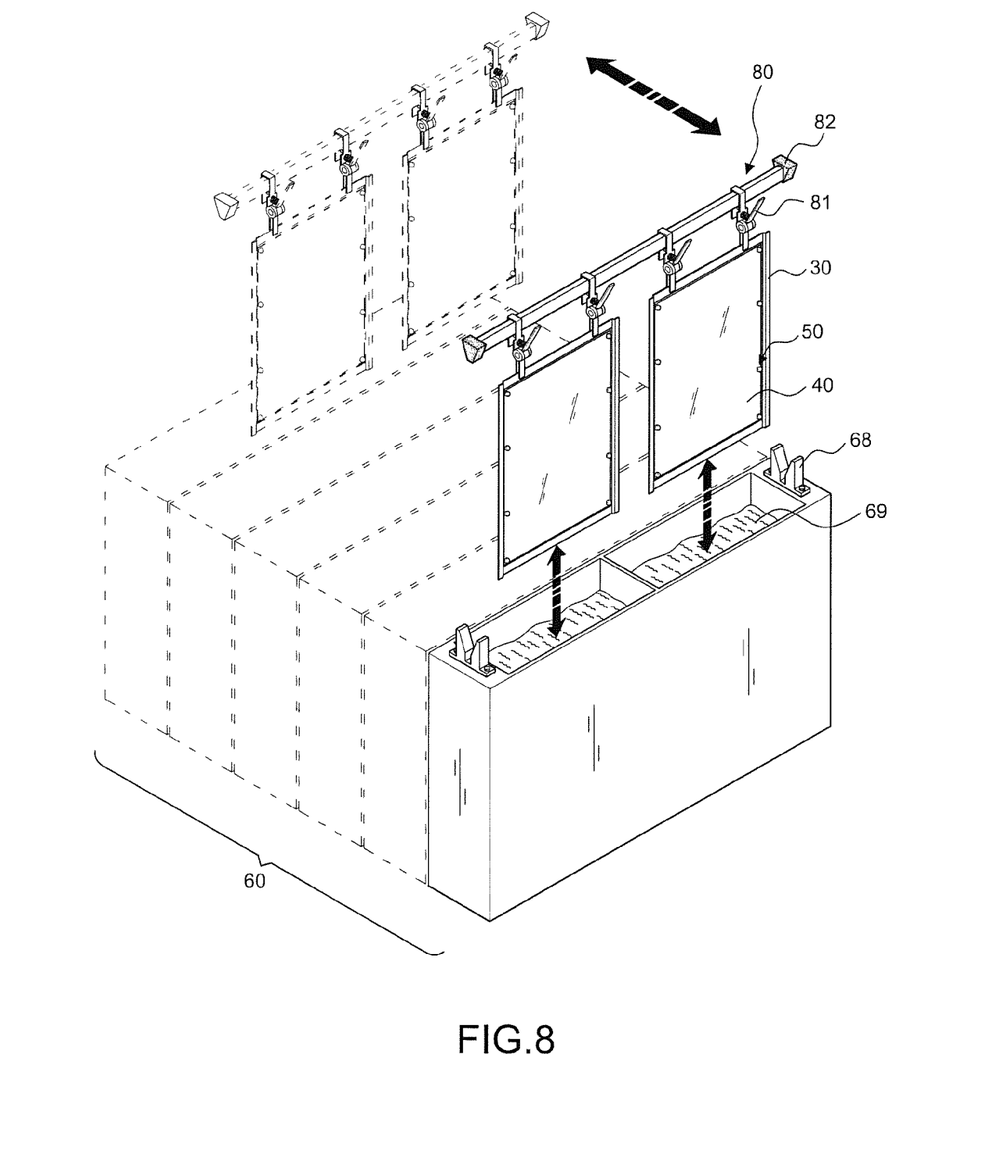
FIG. 8 is an application example of the present invention illustrating the printed circuit board being moved to the different treatment cells by the hoist device.

Referring to FIGS. 3 and 4, the preferred embodiment of a method of thin printed circuit board wet process consistency on the same carrier in accordance with the present invention comprises the steps of:

a) providing a frame 30 including a rectangular rigid frame body made of conductive material and a plurality of flanges 32 inwardly extending from an inside frame edge 31 thereof, and an electroconductive positioning member 33 being set on the flange 32; in this embodiment as shown in FIG. 4C, the frame 30 is composed of metal plate, and the left and right sides of the outer frame extend outwardly to form a stepped surface 34 which has a good mechanical strength; and the frame 30 can be horizontally placed on a horizontal machine, such that the stepped surface 34 can be moved on a roller 35 of the horizontal machine, and an effective area of a thin printed circuit board 40 does not come into contact with any mechanical members to prevent scratches; in another embodiment as shown in FIG. 8 is a vertical machine; the frame 30 further includes a hanger 80 being made of conductive material has a contacted part 82 on both ends thereof, and a plurality of fixtures 81 being provided on the hanger 80 for clamping the frame 30; thus, the frame 30 can be used for horizontal or vertical machine;

b) providing the thin printed circuit board 40 as shown in FIG. 3A, being smaller than the inside frame edge 31 of the frame 30, an edge of the thin printed circuit board 40 having a positioning hole 41 corresponding to the positioning member 33 for hanging the thin printed circuit board 40 on the frame 30, such that the thin printed circuit board 40 stays smooth and flat, and the edge of the thin printed circuit board 40 does not contact with the inside frame edge 31 of the frame 30; that is, there is only a point contact between the periphery of the positioning hole 41 and the positioning member 33; in this embodiment, the positioning member 33 serves as a pin which is perpendicular to the surface of the flange 32 for hanging the positioning hole 41 of the thin printed circuit board 40, but it is not a limitation;

c) providing a plurality of securing members 50 as shown in FIGS. 3B, 4A, and 4B, fixing on the positioning members 33, and the securing member 50 corresponding to a surface of the thin printed circuit board 40 has an electroconductive contacted surface 522, such that the surface of the thin printed circuit board 40 is electronically connected to the frame 30 by the securing members 50 and positioning members 33; in this embodiment, the securing member 50 comprises an external cover 51 being made of elastic material and a metallic buckle 52 being provided at the bottom of the external cover 51; the middle of the metallic buckle 52 corresponding to the positioning member 33 has a buckling hole 521 for clamping the positioning member 33; the metallic buckle 52 having the eletroconductive contacted surface 522 contacting with the surface of the thin printed circuit board 40; in the preferred embodiment, the external cover 51 is made of rubber, and the metallic buckle 52 is made of copper;

For example, the size of the thin printed circuit board 40 is 415×511 mm, and the size of the inside frame edge 31 of the frame 30 is 419×515 mm, wherein the size of thin printed circuit board 40 is larger than the inside frame edge 31, so there is a gap between the thin printed circuit board 40 and the inside frame edge 31, such that the thin printed circuit board 40 does not come into contact with any objects; on the other hand, the thin printed circuit board 40 is fixed by the combination of the plurality of securing members 50, the positioning members (pin) 33 and the flanges 32. The flanges 32 and the plurality of the securing members 50 with a small area are evenly spread on the predetermined area of the thin printed circuit board 40 with a large area.

d) providing a plurality of treatment cells 60 as shown in FIGS. 5 and 6, being arranged in sequence, and a predetermined chemical liquid 69 being required for the wet process is respectively arranged in the treatment cells 60; in this embodiment, the treatment cells 60 mainly includes a plurality of developing cells 62, copper plating cells 63, stripping cells 64, etching cells 65, and may include a peeling cell 66; besides, a loading area 61 and an unloading area 67 are respectively arranged in the front and the back of the treatment cells 60; moreover, the rinsing cells or buffering cells are arranged between the plurality of the treatment cells 60 of each process; for example, there are the rinsing cells or the buffering cells between the developing cell 62 and the copper plating cell 63, and also between the stripping cell 64 and the etching cell 65; this is generally required for the wet process and thus will not be described here; a V-shaped block 68 is provided on both top sides of the treatment cells 60, and both ends of the hanger 60 corresponding to the V-shaped block 68 has the contacted part 82 for setting across on the V-shaped block 68; in this embodiment, the V-shaped block 68 on both sides of the copper plating cell 63 is connected to the power supply, such that the hanger 80 conducts electricity when the contacted part 82 on both ends of the hangers 80 sets across on the V-shaped block 68, and the fixture 81 on the hanger 80 is electronically connected to the frame 30 for a current passing through the positioning member 33 and the securing member 50 of the frame 30 to the thin printed circuit board 40; and e) providing a plurality of hoist devices 70 as shown in FIGS. 7A, 7B and 8, being arranged above the plurality of treatment cells 60, moving back and forth for the frame 30 to be clamped and moved to each designated treatment cell in order to conduct the wet process; in this embodiment, the hoist device 70 includes a set of track 71 being arranged at the both sides of the plurality of treatment cells 60, a hoist 72 being in the ⊓ shape sets across on the set of track 71 and having a power source 73 and a transmission member 74 for the hoist to be moved back and forth on the track 71, and a cross rod 75 being arranged in the middle of the hoist 72 for being vertically hoisted by the transmission member 74, and the hanger 80 can be held by the cross rod 75 and moved to the designated treatment cell for vertically hoisting; however, the structure of the hoist device 70 is a prior art and thus will not be described in details here.

According to steps d) and e), the frame 30 is carried and moved to a loading area by the hoist device 70 and the thin printed circuit board 40 is fixed by using above-mentioned steps a) to c), and the order of the treatment cells 60 in accordance with the wet process is illustrated as following: the developing cell 62, the copper plating cell 63, the stripping cell 64, the etching cell 65, and the buffering cell or the peeling cell 66 to the unloading area 67. However, the wet process is a prior art and thus will not be described in details here. The present invention is to use the same frame 30 for the thin printed circuit board 40 to be moved to the treatment cells 60 with different chemical liquid, and the chemical liquid does not remain on the frame 30 after being cleaned in the rinsing cell to achieve automation consistency by using the frame 30 as the same carrier.

Based on the technical features disclosed, a method of thin printed circuit board wet process consistency on the same carrier in accordance with the present invention is effective to improve the problems of the prior art, the effects are clarified as following:

1. The frame 30 and the thin printed circuit board 40 are fixed together and conducted electricity by the point contacts which can reduce the contacted area between the two, such that the chemical liquid 69 does not remain on the frame 30. Therefore, the present invention can avoid the mix of the chemical liquid between different cells and avoid the impact of the mechanical stress against the thin printed circuit board 40 when fixing improperly, thus it solves the problems of the conventional rack of the printed circuit board.

2. The integration of the conventional process is very difficult because each process has different chemical liquid which is easily attached to the conventional rack of the printed circuit board; thus, it is easy to cause the mixing of different chemical liquid and lead to different chemical reactions. The power supply is needed only in the plating part of the wet process, but the conventional rack is not universal. Therefore, the present invention enables the thin printed circuit board wet process such as developing, copper plating, stripping, and etching to set on an automatic route, and each piece of the thin printed circuit board 40 is hanged by the same frame 30 from the beginning to the end of the wet process; wherein, the plating cell is formed when the V-shaped block 68 on any of the treatment cells 60 connect to the power supply, such that each process is integrated to form a continuous auto-consistent process.

3. Through the continuous auto-consistent process, the thin printed circuit board 40 is moved to the designated treatment cell by the hoist 72. In the preferred embodiment of the present invention, one thin printed circuit board is vertically immersed in one treatment cell without moving the printed circuit board from one process to another, such that the chemical reaction or the plating reaction on the printed circuit board is evenly reacted.

4. A normal horizontal machine uses nozzle pressure independent adjustment, swing spray, etching compensation and so on to overcome the water effect. However, it is complicated and hard to control. Therefore, the frame 30 of the present invention enables the thin printed circuit board 40 to stay smooth and flat and thus reduces the water effect caused by the horizontal process. The vertical process not only can avoid the water effect but enable the chemical liquid to react evenly. Due to the even reaction on both sides of the thin printed circuit board 40 and the fast reaction of the chemical liquid 69, the productivity of the vertical process is higher than the horizontal process.

Many changes and modifications in the above-described embodiment of the invention can, of course, be carried out without departing from the scope thereof. Accordingly, to promote the progress in science and the useful arts, the invention is disclosed and is intended to be limited only by the scope of the appended claims.

What is claimed is:

1. A method for providing thin printed circuit board wet process consistency on the same carrier, comprising the steps of:
   a) providing a frame including a rectangular rigid frame body made of conductive material, the frame body extending about a central opening and defining a plurality of frame edges disposed at opposing sides of the central opening, a plurality of flanges each inwardly projecting into the central opening from an inside frame edge of the frame body, and an electroconductive positioning member being set on each flange;
   b) providing a thin printed circuit board to be disposed within the frame edges of the frame, the thin printed circuit board engaging the flanges to be stopped thereby from passing through the central opening, the thin printed circuit board having a plurality of positioning holes corresponding to the electroconductive positioning members for hanging the thin printed circuit board on the frame, whereby the thin printed circuit board stays smooth and flat, the thin printed circuit board being spaced from the inside frame edges of the frame while maintaining electrical contact therewith through contact between the positioning holes and the positioning members;
   c) providing a plurality of securing members fixing on the positioning members, each securing member corresponding to a surface of the thin printed circuit board has an electroconductive contacted surface, such that the surface of the thin printed circuit board is electronically connected to the frame by the securing members and positioning members;
   d) providing a plurality of treatment cells being arranged in sequence, and a predetermined chemical being required for the wet process is respectively arranged in the treatment cells; and
   e) providing a plurality of hoist devices being arranged above the plurality of treatment cells, moving back and forth for the frame to be clamped and moved to each designated treatment cell in order to conduct the wet process.

2. The method of thin printed circuit board wet process consistency on the same carrier as claimed in claim 1, wherein the frame illustrated in step a) is composed of metal plate.

3. The method of thin printed circuit board wet process consistency on the same carrier as claimed in claim 1, wherein the frame further includes a hanger made of conductive material has a contacted part on both ends thereof, and a purity of fixtures provided on the hanger for clamping the frame.

4. The method of thin printed circuit board wet process consistency on the same carrier as claimed in claim 3, wherein the treatment cells illustrated in step d) include a plurality of developing cells, copper plating cells, stripping cells, etching cells, and peeling cells; a V-shaped block is provided on both top sides of the treatment cells, and both ends of the hanger corresponding to the V-shaped block has the contacted part for setting across on the V-shaped block.

5. The method of thin printed circuit board wet process consistency on the same carrier as claimed in claim 4, wherein the V-shaped block on both top sides of the copper plating cell is connected to the power supply, such that the hanger conducts electricity when the contacted part on both ends of the hanger sets across on the V-shaped block, and the fixture on the hanger is electronically connected to the frame, such that a current pass through the positioning member of the frame and the securing member to the thin printed circuit board for copper plating the through holes of the thin printed circuit board.

6. The method of thin printed circuit board wet process consistency on the same carrier as claimed in claim 1, wherein the securing member as illustrated in step c) comprises:
   a) an external cover being made of elastic material; and
   b) a metallic buckle being provided at the bottom of the external cover, the middle of the metallic buckle corresponding to the positioning member has a buckling hole for clamping the positioning member, and the metallic buckle having the eletroconductive contacted surface contacting with the surface of the thin printed circuit board.

7. The method of thin printed circuit board wet process consistency on the same carrier as claimed in claim 6, wherein the external cover is made of rubber, and the metallic buckle is made of copper.

8. The method of thin printed circuit board wet process consistency on the same carrier as claimed in claim 7, wherein the positioning member serves as a pin which is perpendicular to the surface of the flange for hanging the positioning hole of the thin printed circuit board.

* * * * *